(12) United States Patent
Kim et al.

(10) Patent No.: US 7,215,192 B2
(45) Date of Patent: May 8, 2007

(54) HIGH EFFICIENCY POWER AMPLIFIER

(76) Inventors: Junghyun Kim, W00-wul villa 403 ho, 178-76, Bongchon 11 dong, Kwanak-gu, Seoul (KR); Daehee Lee, Sinnae APT 605-605, Sinnae-Dong 650, Jungrang-gu, Seoul (KR); Sanghwa Jung, Joogong APT 15 dong-401 ho, 532 Gojan-dong, Ansan, Kyunggi-Do (KR); Youngwoo Kwon, 103 Hyunjin Villa, Bundang-dong, Bundang-gu, Seongnam, Kyunggi-Do (KR)

( * ) Notice: Subject to any disclaimer, the term of this patent is extended or adjusted under 35 U.S.C. 154(b) by 0 days.

(21) Appl. No.: 11/396,297

(22) Filed: Mar. 31, 2006

(65) Prior Publication Data

US 2006/0261887 A1 Nov. 23, 2006

Related U.S. Application Data

(63) Continuation of application No. 10/905,796, filed on Jan. 20, 2005, now Pat. No. 7,023,270, which is a continuation of application No. 10/435,529, filed on May 9, 2003, now Pat. No. 6,900,692.

(51) Int. Cl.
*H03F 1/14* (2006.01)

(52) U.S. Cl. .................... 330/51; 330/124 D
(58) Field of Classification Search ........... 330/51, 330/124 D, 302, 151, 310, 284
See application file for complete search history.

(56) References Cited

U.S. PATENT DOCUMENTS

| | | | |
|---|---|---|---|
| 5,152,004 A | 9/1992 | Vaisanen et al. | |
| 5,175,871 A | 12/1992 | Kunkel | |
| 5,276,912 A | 1/1994 | Siwiak et al. | |
| 5,530,923 A | 6/1996 | Heinonen et al. | |
| 5,661,434 A | 8/1997 | Brozovich et al. | |
| 5,758,269 A | 5/1998 | Wu | |
| 5,909,643 A | 6/1999 | Aihara | |
| 6,060,949 A | 5/2000 | Kaufman et al. | |
| 6,069,526 A | 5/2000 | Ballantyne | |
| 6,130,589 A | 10/2000 | Yamaguchi et al. | |
| 6,205,318 B1 | 3/2001 | Schindler et al. | |
| 6,356,150 B1 | 3/2002 | Spears et al. | |
| 6,362,685 B1 | 3/2002 | Vagher | |
| 6,363,685 B1 | 4/2002 | Kugler | |
| 6,374,116 B1 | 4/2002 | Peterzell et al. | |
| 6,487,419 B1 | 11/2002 | Freed | |
| 6,603,359 B2 | 8/2003 | Fujiwara et al. | |
| 6,674,323 B2 | 1/2004 | Kagaya et al. | |
| 6,700,439 B2* | 3/2004 | Jackson | 330/9 |
| 6,781,455 B2* | 8/2004 | Kim | 330/51 |
| 6,809,587 B2 | 10/2004 | Ghannouchi et al. | |
| 6,900,692 B2 | 5/2005 | Kim et al. | |

FOREIGN PATENT DOCUMENTS

KR 2001-0105151 11/2001

OTHER PUBLICATIONS

English Abstract and drawing corresponding to Korean patent document No. 2001-0105151, 2 pages.

* cited by examiner

*Primary Examiner*—Henry Choe
(74) *Attorney, Agent, or Firm*—Townsend and Townsend and Crew LLP

(57) ABSTRACT

A multiple power mode amplifier provides a low and a high power mode without using switches. This amplifier may be used in RF applications such as mobile telephones. In the low power mode, the power consumption of the amplifier is reduced, which will increase operation time, especially important for battery-operated devices. In one implementation, the amplifier includes a number of impedance matching network units, impedance transformer, and a power stage.

21 Claims, 6 Drawing Sheets

HIGH EFFICIENCY POWER AMPLIFIER

This application is a continuation of U.S. patent application Ser. No. 10/905,796, filed Jan. 20, 2005, now U.S. Pat. No. 7,023,270 which is a continuation of U.S. patent application Ser. No. 10/435,529, filed May 9, 2003, now U.S. Pat. No. 6,900,692, which claims priority under 35 U.S.C. §119 to Korean patent application number 2003-208, filed on Jan. 3, 2003, which are hereby incorporated by reference, along with all other references cited in this application.

BACKGROUND OF THE INVENTION

The present invention relates to a power amplifier, especially a radio frequency (RF) amplifier used in mobile handset and other battery-powered applications (e.g., portable wireless devices, personal digital assistants (PDAs), notebook computers, and others). More particularly, the present invention relates to a multiple power mode power amplifier with high efficiency appropriate for amplifying power corresponding to various output power levels without using bypass switching circuits.

Mobile handsets or mobile telephones (also sometimes called cell phones) for wireless communication services are becoming smaller and lighter. This also means a size of the battery, which is a typically a sizeable portion of a mobile handset, is also becoming smaller in order to facilitate a smaller and lighter mobile handset. But at the same time a telephone and its battery is becoming smaller, it is desirable to extend a talk time of a mobile handset. As can be appreciated, these are difficult goals to reconcile; if the power drain of a device remains the same and the battery is smaller, operating time of the device per battery charge becomes shorter.

In a conventional mobile handset, the radio frequency (RF) power amplifier consumes most of the power of the overall system of the mobile handset. Thus, low efficiency of the RF power amplifier degrades the efficiency of the overall system, drains the battery more rapidly, and thus reduces the talk time. For this reason, much research in this field concentrates on increasing the efficiency of the RF power amplifier. If the RF power amplifier is more efficient, this reduces power drain and the battery, which in turn increases talk time or the operating time of the device per batter charge.

A multiple power mode power amplifier is one of the devices introduced recently as a result of such research conducted to increase efficiency of the RF power amplifier. The multiple power mode power amplifier is configured to operate its own power stage corresponding to a desired situation and is operated in one of several operation modes corresponding to output power levels, as discussed in U.S. Pat. Nos. 5,152,004; 5,175,871; 5,276,912; 5,530,923; 5,661,434; 5,758,269; 5,909,643; 6,060,949; 6,069,526; and 6,356,150, all of which are incorporated by reference. Bypass switching circuits have been used for such operations of the multiple power mode power amplifier.

If low output power is required, it is desirable to adjust a path of power transmission to bypass a power stage. In contrast, if the high output power is required, it is desirable to adjust a path of power transmission to pass the power stage in order to provide high output power. Using a conventional multiple power mode power amplifier (which uses bypass switches) that selectively performs mode transition corresponding to desired output power levels, it is possible to reduce DC power consumption at the time of transferring signals of low output power.

However, the multiple power mode power amplifier with switches (e.g., PIN diodes) is relatively costly to manufacture and the switches reduce efficiency somewhat because they may have negative gain (e.g., 1 dB gain per switch). Further, more than one power stage among a plurality of power stages connected to each other in serial should be switched in order to implement the multiple power mode power amplifiers, and more than one bypass switching circuits and a complex logical control circuit for controlling the bypass switching circuits are required for the switching operation.

Power losses caused by switching operations at the bypass switching circuits causes a reduction of output power and the reduction of output power causes reduction of efficiency of the multiple power mode power amplifier. Further, there is another problem in that an adjacent channel power ratio (ACPR) gets worse. Furthermore, the size of the entire system gets larger due to bypass switching circuits themselves and the complex logical control circuit additionally added for controlling the bypass switching circuits, so that the conventional multiple power mode power amplifier is considered as regressive considering a trend towards a smaller-sized mobile handset. Also the enlarged size of the entire system is disadvantageous in price competitiveness, particularly since the switches are expensive components.

Therefore, it is a need to provide a more power efficient power amplifier, and in particular, a multiple power mode amplifier that does not use any switches.

SUMMARY OF THE INVENTION

The present invention is a multiple power mode power amplifier that amplifies power of various levels with a bypass circuit not including switches, so that problems of power loss, increased size, and increased cost associated with conventional multiple power mode power amplifier using bypass switches may be avoided. Further, the multiple power mode power amplifier of the invention reduces DC power consumption in the low power mode, so that power added efficiency (PAE) characteristics of the power amplifier is improved and operation time of a portable electronic device (e.g., talk time of a mobile handset) equipped with the present multiple power mode power amplifier may be extended.

In one embodiment, the multiple power mode amplifier uses a variable gain amplifier as a driver to minimize power loss associated with the conventional multiple power mode power amplifier in the high power mode, so that PAE characteristics in the high power mode may be improved and poor linearity in the high power mode may be solved. In addition, improvement in sound quality and size reduction of the mobile handset may be obtained in a mobile handset or telephone equipped with the present multiple power mode power amplifier.

An embodiment of the present invention solves at least the above problems of the conventional multiple power mode power amplifier using bypass switches and provides a multiple power mode power amplifier with high efficiency that may amplify power of various levels without using bypass switches by making a path for bypassing a power stage and a path for passing through a power stage joined at an optimum point and providing an optimum impedance transformer on the path for bypassing the power stage.

In an embodiment, the invention is a multiple power mode power amplifier with high efficiency includes a power stage for receiving power amplified by a driver through a first impedance matching unit connected in serial to the driver amplifying input power and a second impedance matching unit connected to the first impedance matching unit, reamplifying the power and outputting the reamplified power; an applied voltage control circuit, connected to the power stage, for controlling applied voltages corresponding to a first power mode and a second power mode; an impedance transformer for receiving power amplified by the driver through the first impedance matching unit, according to operations of the applied voltage control circuit; a third impedance matching unit, connected to the power stage in serial, for receiving power amplified by the power stage, according to operations of the applied voltage control circuit; and a fourth impedance matching unit, connected to the third impedance matching unit and connected to the impedance transformer, for transferring power, transferred from the third impedance matching unit or the impedance transformer, to an output stage according to operations of the applied voltage control circuit.

According to one implementation, the power stage is connected to the second impedance matching unit in serial, and in the second power mode, the power stage receives power amplified by the driver through the second impedance matching unit and reamplifies the power.

In an implementation, the applied voltage control circuit adjusts voltage applied to the power stage in order for the power stage to be off in the first power mode and in order for the power stage to be on in the second power mode.

In an implementation, the impedance transformer is connected in a parallel branch to the second impedance matching unit, the power stage and the third impedance matching unit, and in the first power mode, the impedance transformer receives through the first impedance matching unit the power amplified by the driver and outputs the power to the fourth impedance matching unit. Further, the impedance transformer has the structure of a band-pass filter.

In an implementation, the third impedance matching unit prevents power transferred through the impedance transformer from leaking to the power stage.

In an implementation, the fourth impedance matching unit receives power from the impedance transformer in the first power mode and the fourth impedance matching unit receives power from the third impedance matching unit in the second power mode.

In an implementation, a path, that power which passed through the first impedance matching unit is transferred to the fourth impedance matching unit, is determined by comparing impedance as viewed from the first impedance matching unit towards the power stage and impedance as viewed from the first impedance matching unit towards the impedance transformer.

In an implementation, the impedance as viewed from the first impedance matching unit towards the impedance transformer forms a part of an interstage matching unit between the driver and the power stage together with the first impedance matching unit in the second power mode.

In another embodiment, a multiple power mode power amplifier with high efficiency includes a driver for variably amplifying gain of input signal using a variable gain amplifier; a power stage for receiving power amplified by the driver through a first impedance matching unit connected to the driver in serial and a second impedance matching unit connected to the first impedance matching unit, reamplifying the power and outputting the reamplified power; an applied voltage control unit, connected to the power stage, for controlling an applied voltage corresponding to the first power mode and the second power mode; an impedance transformer for receiving through the first impedance matching unit power amplified by the driver according to operations of the applied voltage control circuit; a third impedance matching unit, connected to the power stage in serial, for receiving power amplified by the power stage according to operations of the applied power control circuit; and a fourth impedance matching unit, connected to the third impedance matching unit and connected to the impedance transformer, for transferring the power transferred from the third impedance matching unit or the impedance transformer, to an output stage according to operations of the applied voltage control circuit.

In an implementation, the power stage is connected to the second impedance matching unit in serial, and in the second power mode, the power stage receives through the second impedance matching unit power amplified by the driver and reamplifies the power.

In an implementation, the applied voltage control circuit controls the driver in order for gain of signal inputted into the driver to be differently amplified corresponding to the first power mode and the second power mode. The applied voltage control circuit adjusts voltage applied to the power stage in order for the power stage to be off in the first power mode and in order for the power stage to be on in the second power mode.

The amplifiers may have more than two power modes. For example, the amplifier may have three, four, five, six, or even greater number of modes, such as several different power modes using various amounts of power.

In an implementation, the impedance transformer is connected in parallel to a circuit branch including the second impedance matching unit, the power stage, and the third impedance matching unit, and in the first power mode, the impedance transformer receives through the first impedance matching unit power amplified by the driver and outputs the power to the fourth impedance matching unit. The impedance transformer has the structure of a band-pass filter.

In an implementation, the third impedance matching unit prevents power transferred through the impedance transformer from leaking to the power stage.

In an implementation, the fourth impedance matching unit receives power from the impedance transformer in the first power mode and the fourth impedance matching unit receives power from the third impedance matching unit.

In an implementation, a path, for power passing through the first impedance matching unit is transferred to the fourth impedance matching unit is determined by comparing impedances as viewed from the first impedance matching unit towards the power stage and impedance as viewed from the first impedance matching unit towards the impedance transformer.

In an implementation, the impedance as viewed from the first impedance matching unit towards the impedance transformer forms a part of an interstage matching unit between the driver and the power stage together with the first impedance matching unit in the second power mode.

In one embodiment, a multiple power mode amplifier configured for use in a portable electronic device includes a driver to provide power. A power stage transistor includes an input node and an output node. The input node of the power stage transistor is coupled to the driver to receive the power from the driver in a high power mode. An impedance transformer includes an input node and an output node and is provided in a parallel branch to the power stage transistor. The input node of the impedance transformer is configured to receive the power from the driver in a low power mode.

In another embodiment, a portable electronic device includes a power source and a power amplifier coupled to the power source. The power amplifier includes a driver to provide power; a power stage transistor including an input node and an output node, the input node of the power stage transistor being coupled to the driver to receive the power from the driver and configured to receive power from the driver in a high power mode; and an impedance transformer including an input node and an output node and provided in a parallel branch to the power stage transistor, the input node of the impedance transformer being configured to receive the power from the driver in a low power mode.

In another embodiments a multiple power mode amplifier configured for use in a mobile phone includes a driver to provide power; a power stage transistor including an input node and an output node, the input node of the power stage transistor being coupled to the driver and being configured to receive the power from the driver during a high power mode operation; a first impedance matching unit coupled to the driver to receive the power output by the driver; a second impedance matching unit provided between the first impedance matching unit and the power stage transistor; an impedance transformer including an input node and an output node and provided in a parallel branch to the power stage transistor, the input node of the impedance transformer being configured to receive the power from the first impedance matching unit during a low power mode operation; a third impedance matching unit having a first side and a second side, the first side of the third impedance matching unit being coupled to the output node of the power stage transistor; and a fourth impedance matching unit being coupled to the second side of the third impedance matching unit and the output node of the impedance transformer.

In yet another embodiment, a multiple power mode power amplifier includes a power stage transistor configured to receive first power from a driver via first and second impedance matching units during a high power mode and output second power that is greater than the first power; an applied voltage control circuit coupled to the power stage transistor and configured to apply a first signal to the power stage transistor during the high power mode to turn on the power stage transistor and apply a second signal to the power stage transistor during a low power mode to turn off the power stage transistor; an impedance transformer configured to receive third power from the driver via the first impedance matching unit during the low power mode, the third power being less than the second power; a third impedance matching unit coupled to the power stage transistor in series and configured to receive the second power output by the power stage transistor during the high power mode; and a fourth impedance matching unit coupled to the third impedance matching unit in series and configured to receive the second power from the third impedance matching unit or third power from the impedance transformer and transfer the received second or third power to an output stage.

According to another aspect, the invention includes the use of an amplifier circuit having multiple modes and without switches in a wireless transmitter or transceiver device such as a mobile telephone. The invention includes the use of an amplifier circuit having multiple modes and without switches to extend transmit time of a portable wireless device, while extending transmit time. The invention includes the use of an amplifier circuit having multiple modes and without switches to increase the battery life of a portable wireless device. The invention includes the use of an amplifier circuit having two or more modes without switches to operate in a low power or a high power mode depending on a distance to a receiving antenna, thus improving efficiency and reducing power consumption. The invention includes the use of a change in an impedance of a power stage to change from a low or high power, or vice versa, without using switches. The invention includes the use of impedance network to change from one power mode to another power mode for an amplifier without switches.

Other objects, features, and advantages of the present invention will become apparent upon consideration of the following detailed description and the accompanying drawings, in which like reference designations represent like features throughout the figures.

DETAILED DESCRIPTION

Figure 1:
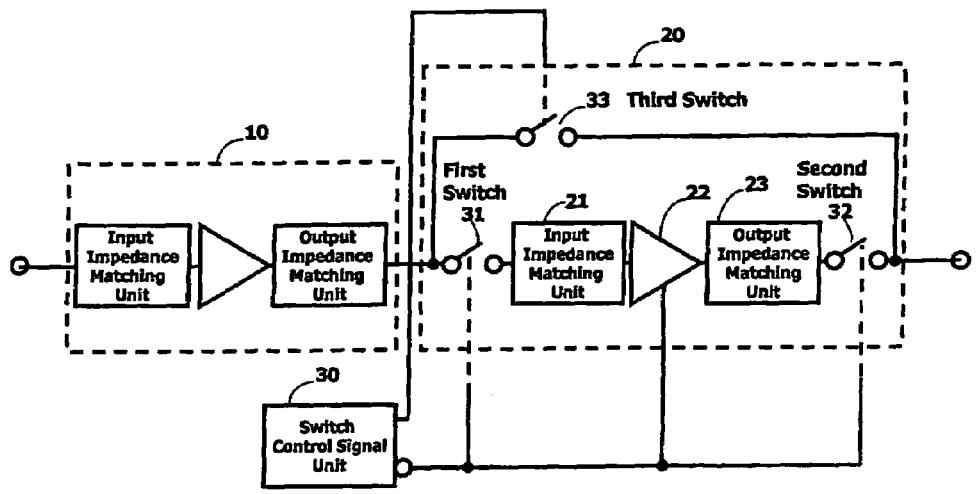
FIG. 1 illustrates a conventional multiple power mode power amplifier using bypass switches.

FIG. 1 illustrates a conventional multiple power mode power amplifier using bypass switches or bypass switch circuits. The multiple power mode power amplifier illustrated in FIG. 1 is configured using three bypass switch circuits.

If the power amplifier is operated in the high power mode, both a first switch 31 and a second switch 32 are closed and a third switch 33 is open, so that output of a driver 10 including an impedance matching unit is input into a power stage 22 (or power amplifying component). In contrast, if the power amplifier is operated in the low power mode, both the first switch 31 and the second switch 32 are open and the third switch 33 is closed, so that output of the driver 10 including the impedance matching unit bypasses the power stage 22.

The multiple power mode amplifier illustrated in FIG. 1 has disadvantages in that the size of the entire system increases and power loss of the entire system increases due to power loss of the bypass switch circuits. Especially, power loss of the second switch 32 connected to an output terminal of the power stage affects greatly the efficiency and linearity of the operation in the high power mode, so that a bypass switch circuit having great power capacity and excellent loss characteristic should be used; however, the use of a bypass switching circuit with a large power handling capability and extremely low power loss requires high cost.

For example, a typical switch may be a PIN diode that has a −1 dB gain. When there are multiple switches in series (i.e., serial switches), the gain loss is cumulative. Also PIN diodes are typically not integrated with the amplifier, which increases the number of integrated circuits (ICs) or chips or components needed. This increases cost. Also, PIN diodes themselves are relatively costly to include in a circuit. Some examples of other types of switches are relays, micromachined switches, transistor switches, PIN diode switches, and Schottky diode switches.

A switch can be made out of active or passive devices. Some common active device switches are PIN diodes, Schottky diodes, and transistors. The term "active" means that DC supply and power consumption are needed for the device to operate properly.

A switch may also be implemented using passive devices such as mechanical relays. Also, recently with the development of MEMS (microelectromechanical system) technology, the micromachined mechanical switches are also possible, which can be used in the integrated circuits. For passive switches, no power consumption is needed, but control DC signals are still needed for operation.

All in all, these can all be categorized as switches or switch devices, and they share three distinct features. They add loss to the signals and add cost to the whole system. Also, external control signals are needed to turn on and off the switches.

Figure 2:
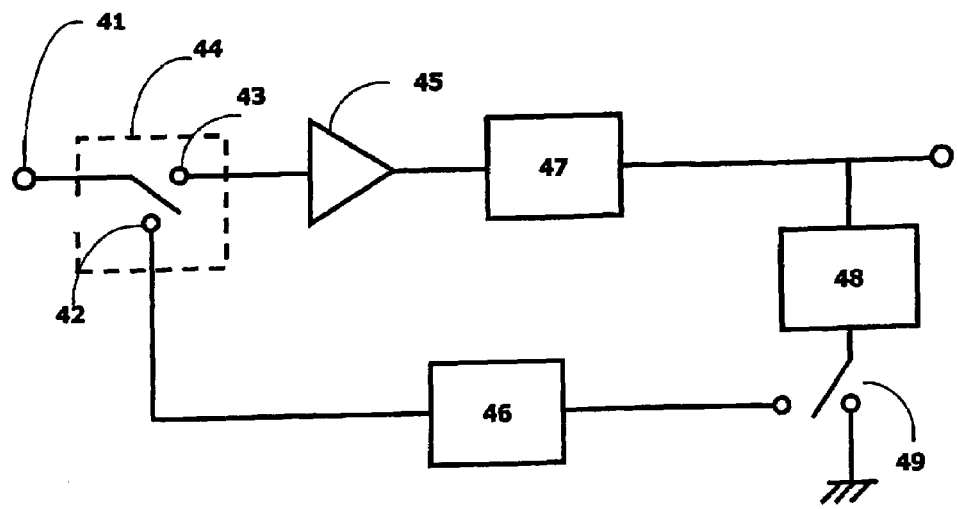
FIG. 2 illustrates a conventional multiple power mode power amplifier using other bypass switches.

FIG. 2 illustrates a conventional multiple power mode power amplifier using other bypass switch circuits. The multiple power mode power amplifier illustrated in FIG. 2 is configured using a combination of a SPDT (single-pole and double-throw) switch and a shunt (not serial) switch in the bypass path.

An input signal to be amplified is coupled to a pole 41 of a switch 44. The switch 44 can be operated so as to couple the input signal at pole 41 to either throw 42 or to throw 43. The throw 43 is coupled to the input of a power amplifying stage 45. The output of the power amplifying stage 45 is coupled to a first side of a first impedance-transforming unit 47. A second side of the unit 47 is coupled to an output node 50. The throw 42 is coupled to a first side of a second impedance-transforming unit 46. A third impedance transforming unit 48 has a first side directly coupled to the second side of impedance transforming network 47 and to the output node 50. A second side of the impedance transforming unit 48 is switched by a switch 49 between a second side of impedance transforming unit 46 and ground.

The operation of switch 49 is coordinated with the operation of switch 44. The impedance transforming units have impedance values selected so that in a high power mode, i.e., when the input signal is coupled via the switch 44 to the amplifying stage 45, the output of the amplifying stage 45 sees the correct load impedance through the impedance transforming unit 47. When operating in a low power mode, i.e., when switch 44 connects to the throw 42 and routes the input signal via the impedance transforming unit 46, the input signal also sees the correct load impedance through the impedance transforming unit 46.

Since the power amplifier illustrated in FIG. 2 should use at least two switches, characteristic gets worse due to inherent losses of the switches and manufacturing costs also increases due to use of relatively expensive switches and a bigger power amplifying stage.

Figure 3A:
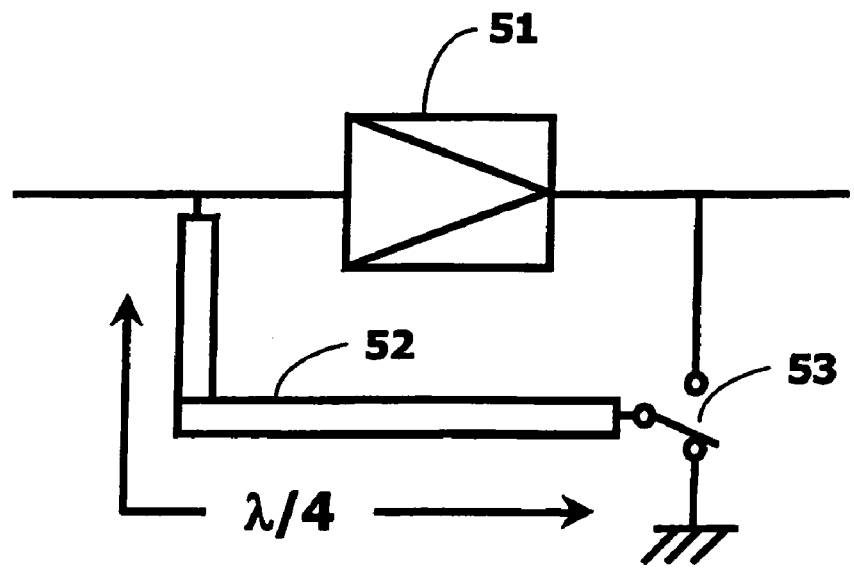
FIG. 3a illustrates a conventional multiple power mode power amplifier using a bypass switch, of which the switch is connected to an output terminal of $\lambda/4$ bypass transmission line.

FIG. 3a illustrates a conventional multiple power mode power amplifier using a bypass switch circuit, of which switching circuit is connected to an output terminal of $\lambda/4$ bypass transmission line. The multiple power mode power amplifier illustrated in FIG. 3a includes a carrier amplifier 51 and has a bypass implemented by a bypass switch circuit configured by using $\lambda/4$ bypass transmission line 52 and a shunt switch 53.

In a high power mode, the shunt switch 53 of the bypass switch circuit is connected to the ground and the bypass switching circuit including the shunt switch 53 is operated as a short-circuited stub by being connected to the $\lambda/4$ bypass transmission line 52, and presents an open circuit seen from the carrier amplifier.

In a low power mode, the shunt switch 53 of the bypass switching circuit is connected to an output terminal of the carrier amplifier 51 and is operated as an bypass together with the $\lambda/4$ bypass transmission line 52.

Figure 3B:
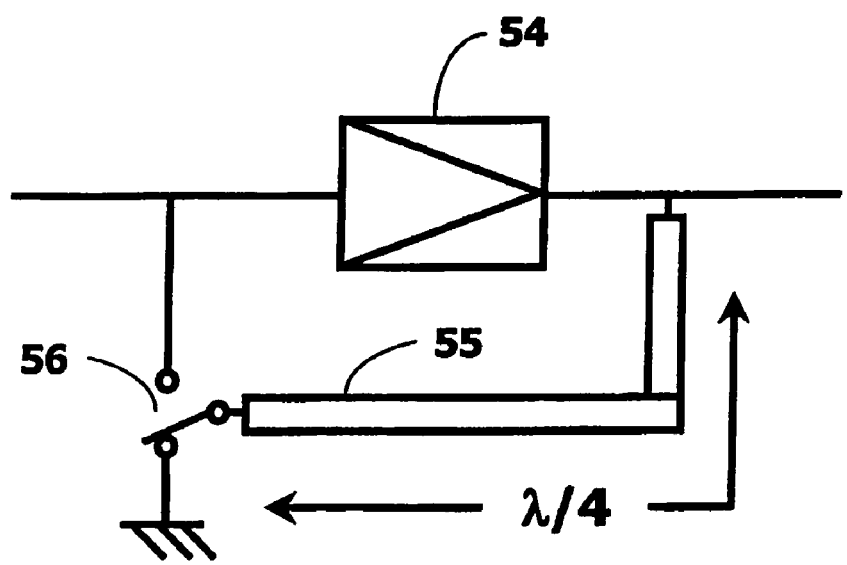
FIG. 3b illustrates a conventional multiple power mode power amplifier using a bypass switch, of which the switch is connected to an input terminal of $\lambda/4$ bypass transmission line.

FIG. 3b illustrates a conventional multiple power mode power amplifier using a bypass switch circuit, of which the switch circuit is connected to an input terminal of $\lambda/4$ bypass transmission line.

A difference between the multiple power mode power amplifier illustrated in FIG. 3b and the multiple power mode power amplifier illustrated in FIG. 3a is only the order of a $\lambda/4$ bypass transmission line and a bypass switch circuit.

Since the multiple power mode power amplifier illustrated in FIGS. 3a and 3b includes only one bypass switch circuit, it has an advantage in that the size of the entire system is small. However, at the same time, it has a disadvantage in that bandwidth is limited due to use of a $\lambda/4$ bypass transmission line and requires a large area to accommodate the long transmission line.

Figure 4:
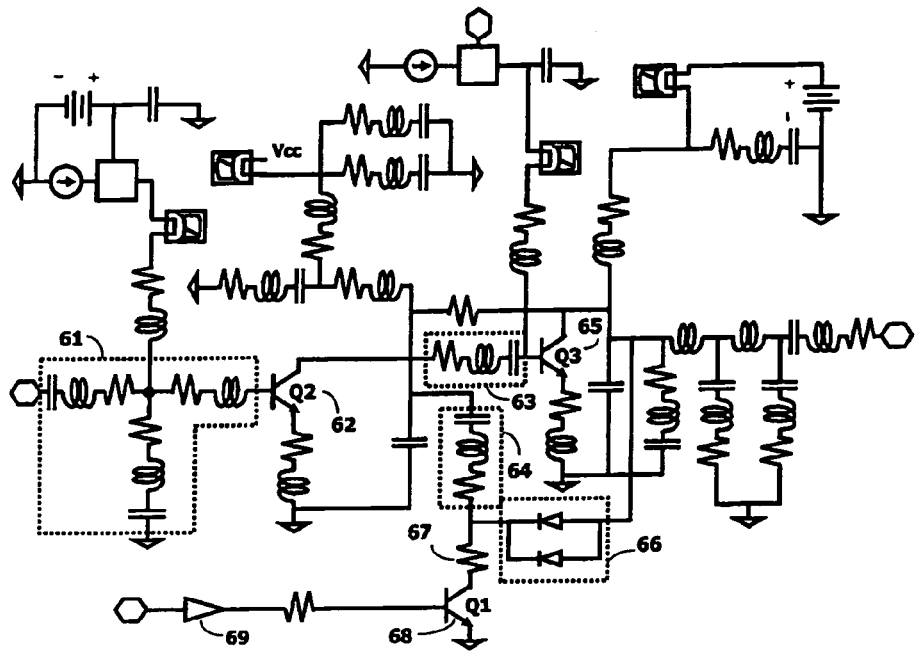
FIG. 4 illustrates a conventional multiple power mode power amplifier using other bypass switches.

FIG. 4 illustrates a conventional multiple power mode power amplifier using other bypass switch circuits. The power amplifier includes an input stage transistor 62, an output amplifier stage transistor 65, a serial switch 66 comprising two parallel diodes, and a switching transistor 68.

In a high power mode, the switching transistor 68 is off and the serial switch 66 is open. Accordingly, output of the input stage transistor 62 is inputted into the output stage transistor 65 and a first impedance matching unit 63 that transforms input impedance into impedance of 15 ohms.

In a low power mode, base bias of the output stage transistor 65 is off and the switching transistor 68 is on, so that the switch 66 is closed. A second impedance matching unit 64 transforms load impedance into impedance of 25 ohms. The second impedance matching unit 64 has smaller impedance than input impedance of the output stage transistor 65 when the switch 66 is closed and has bigger impedance than input impedance of the output stage transistor 65 when the switch 66 is open. Thus, the second impedance matching unit 64 operates as a bypass.

In the following part of this patent, a detailed explanation is given with reference to the attached drawings as to the multiple power mode power amplifier with high efficiency in accordance with embodiments of the present invention. As used in the application, a first power mode is also referred to as the low power mode, and a second power mode is also referred as the high power mode.

Figure 5:
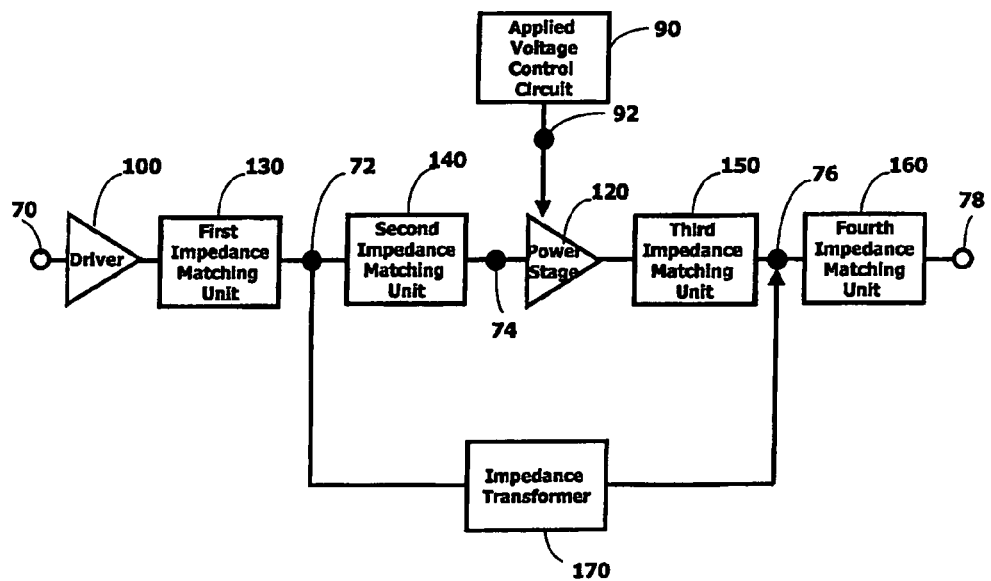
FIG. 5 illustrates a multiple power mode power amplifier with high efficiency using power mode transition structure without a bypass switch according to one embodiment of the present invention.

FIG. 5 illustrates a multiple power mode power amplifier with high efficiency using power mode transition structure without a bypass switch circuit according to one embodiment of the present invention. In other words, the amplifier does not include any switches or switch devices in its circuitry. As has been mentioned above, some examples of switches include relays, micromachined switches, transistor switches, PIN diode switches, and Schottky diode switches.

The approach of the present invention does not use any switches and is free from external control circuits provided to control the switches and the added cost and loss due to having switches. This allows one to implement a circuit such as a multiple mode amplifier in a compact, simple manner and a cost-effective way. Further, no loss means that the performance (i.e., linearity and efficiency) can be maximized. Although described respect to a multiple mode amplifier, techniques of the present invention may be applied to other types of circuit besides amplifiers.

The multiple power mode power amplifier with high efficiency illustrated in FIG. 5 includes: a driver 100 for amplifying input power; a power stage 120 for receiving power amplified by the driver 100 through a first impedance matching unit 130 (see FIG. 4) connected to the driver and a second impedance matching unit 140 connected to the first impedance matching unit 130, reamplifying the power and outputting the reamplified power; an applied voltage control circuit 90, connected to the power stage 120, for controlling applied voltages corresponding to the low power mode and the high power mode; an impedance transformer 170 for receiving power amplified by the driver 100 through the first impedance matching unit 130, according to operations of the applied voltage control circuit 90 and transferring the power to a fourth impedance matching unit 160; a third impedance matching unit 150, connected to the power stage 120 in serial, for transferring power amplified by the power stage 120 to the fourth impedance matching unit 160; and the fourth impedance matching unit 160, connected to the third impedance matching unit 150 and connected to the impedance transformer 170, for transferring power, transferred from the third impedance matching unit 150 or the impedance transformer 170, to an output stage 78 according to operations of the applied voltage control circuit 90.

As will be explained below, in one embodiment, the power stage 120 includes one or more transistors to regulate the flow of power through it. The power stage 120 may also amplify the power received from the driver 100 during the high power mode operations. Accordingly, the power stage 120 is also referred to as "power amplifier stage" and "power stage transistor." In an embodiment, the power stage includes one or more transistors. For example, the output driver may include at least two output driver transistors.

The applied voltage control circuit 90 adjusts a voltage applied to the power stage 120 by exterior control signal inputs corresponding to the low power mode and the high power mode. Since output power is reduced in the low power mode by passing through not the power stage 120, but the optimized first impedance matching unit 130 and the optimized impedance transformer 170 the applied voltage control circuit 90 adjusts the voltage applied to the power stage 120 in order for transistors of the power stage 120 to be off. This reduces power consumption.

In contrast, in the high power mode, since output power is increased by passing through the first impedance matching unit 130, the second impedance matching unit 140 and the power stage 120, the applied voltage control circuit 90 applies voltage appropriate for operations of transistors of the power stage 120. This increases power consumption.

In the low power mode, the driver 100 amplifies input power and transfers the amplified power to the impedance transformer 170 through the optimized first impedance matching unit 130. In contrast, in the high power mode, the driver 100 amplifies input power and transfers the amplified power to the power stage 120 through the optimized first impedance matching unit 130 and the optimized second impedance matching unit 140.

The power stage 120 in the low power mode is turned off by the applied voltage control circuit 90, while in the high power mode, the power stage 120 is turned on and amplifies the signal to be transmitted, amplified by the driver 100 and inputted into the power stage 120.

The first impedance matching unit 130 is a circuit optimized for optimal operations corresponding to the low power mode or the high power mode. The first impedance matching unit 130 transfers input power amplified by the driver 100 corresponding to the operation mode to the impedance transformer 170 or the power stage 120.

The second impedance matching unit 140 is a circuit optimized for optimal operations corresponding to the low power mode and the high power mode. In the low power mode, the second impedance matching unit 140 transfers power, amplified by the driver 100 and transferred through the first impedance matching unit 130, to the impedance transformer 170 and in the high power mode, to the power stage 120.

The impedance transformer 170 is an impedance transforming circuit that transforms impedance appropriately corresponding to the low power mode or the high power mode. In the low power mode, the impedance transformer 170 forms a path that bypasses the power stage 120, so that output of the driver 100 is transferred to output stage 78 of the power amplifier.

Figure 6:
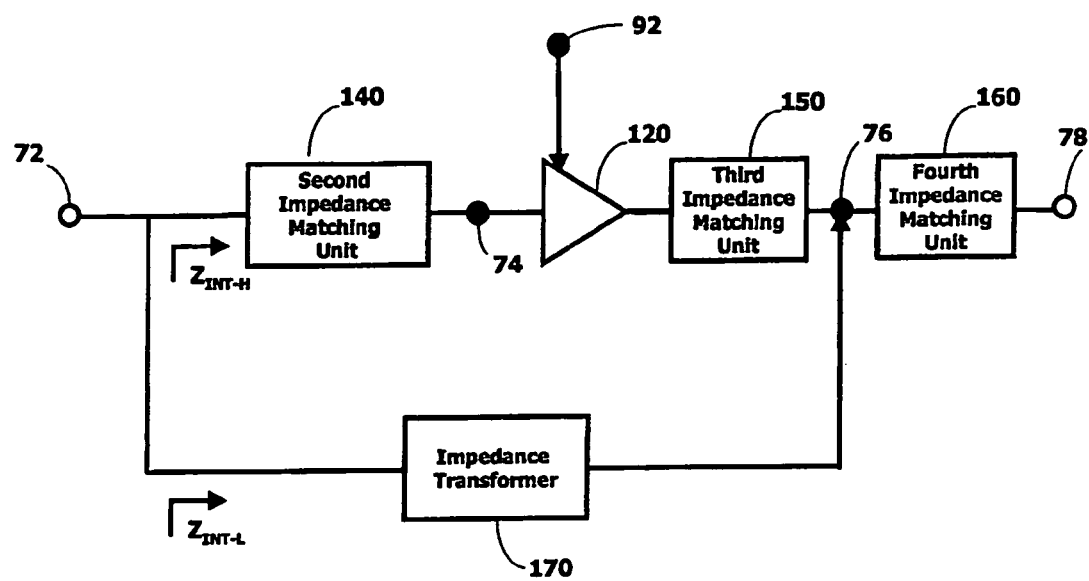
FIG. 6 illustrates the multiple power mode power amplifier with high efficiency illustrated in FIG. 5 in detail for explaining power mode transition structure without a bypass switch.

FIG. 6 illustrates the multiple power mode power amplifier with high efficiency illustrated in FIG. 5 in more detail for explaining the power mode transition structure without bypass switching circuit.

Output power of the driver 100 reaches a junction 72. At junction 72, the path divides corresponding to power modes via the first impedance matching unit 130.

In the low power mode, the power stage 120 is off by voltage applied by the applied voltage control circuit 90, and input impedance Z INT-H of the power stage 120 as viewed from the first impedance matching unit 130 (see FIG. 5) is larger than input impedance Z INT-L of a path bypassing the power stage 120 as viewed from the first impedance matching unit 130. The input impedance Z INT-H may be significantly or substantially larger than the input impedance Z INT-L. In an implementation, Z INT-H is about two times larger than Z INT-L. In an implementation, Z INT-H is about three times larger than Z INT-L. In an implementation, Z INT-H is more than two times larger than Z INT-L. In an implementation, Z INT-H is more than three times larger than Z INT-L. In an implementation, Z INT-H is in a range from about two to about three times larger than Z INT-L. In an implementation, Z INT-H is less than about three times larger than Z INT-L. In an implementation, Z INT-H is greater than two larger than Z INT-L, but less than about three times larger than Z INT-L.

The design of impedance transformer 170 is optimized in conjunction with the third impedance matching unit 150 and the fourth impedance matching unit 160 to lower the impedance level as viewed from the first impedance matching unit 130. Thus, a power signal amplified by the driver 100 and transferred to the junction 72 is optimized so that the amount of power inputted into the impedance transformer 170 is significantly or substantially larger than the amount of power inputted into the power stage 120. The output power signal is transferred to the output stage 78 with minimizing power leakage to the power stage by impedance transforming action of 170 in conjunction with the third impedance matching unit 150 and the fourth impedance matching unit 160.

In the high power mode, the power stage 120 is on, controlled by a voltage applied by the applied voltage control circuit 90, and input impedance Z INT-H of the power stage 120 as viewed from the first impedance matching unit 130 is smaller than input impedance Z INT-L of a path bypassing the power stage 120 as viewed from the first impedance matching unit 130. The impedance transformer 170 is optimally designed in conjunction with the third impedance matching unit 150 and the fourth impedance matching unit 160 to increase Z INT-L of a bypass path well above Z INT-H of the power stage 120 in the high power mode. The second impedance matching unit 140 is designed to boost up the impedance level as viewed from the first impedance matching unit 130 while providing interstage matching in the high power mode. Thus, most power, amplified by the driver 100 and transferred to the junction 72, is amplified by the power stage 120 and is transferred to the output stage 78 of the power amplifier, while minimizing power leakage to the impedance transformer 170 by the optimized third impedance matching unit 150 and the optimized fourth impedance matching unit 160.

Input impedance Z INT-L of a path bypassing the power stage 120 as viewed from the first impedance matching unit 130 forms an interstage matching unit between the driver 100 and the power stage 120 together with the first impedance matching unit 130 and the second impedance matching unit 140 in the high power mode, so that output power of the driver 100 is well transferred to the power stage 120.

In the high power mode, the input impedance Z INT-L may be significantly or substantially larger than the input impedance Z INT-H. In an implementation, Z INT-L is about two times larger than Z INT-H. In an implementation, Z INT-L is about three times larger than Z INT-H. In an implementation, Z INT-L is more than two times larger than Z INT-H. In an implementation, Z INT-L is more than three times larger than Z INT-H. In an implementation, Z INT-L is in a range from about two to about three times larger than Z INT-H. In an implementation, Z INT-L is less than about three times larger than Z INT-H. In an implementation, Z INT-L is greater than two larger than Z INT-H, but less than about three times larger than Z INT-H.

In the low power mode, the power stage is in what may be referred to as an off state, and in the high power mode, the power stage is in what may be referred to as an on state. In the on state, the power stage consumes significantly more power than in the off state. Furthermore, in an implementation, an input impedance to the power stage is about two times larger in the off state as compared to the on state. In an implementation, an input impedance to the power stage is greater than about two times larger in the off state as compared to the on state.

Figure 7A:
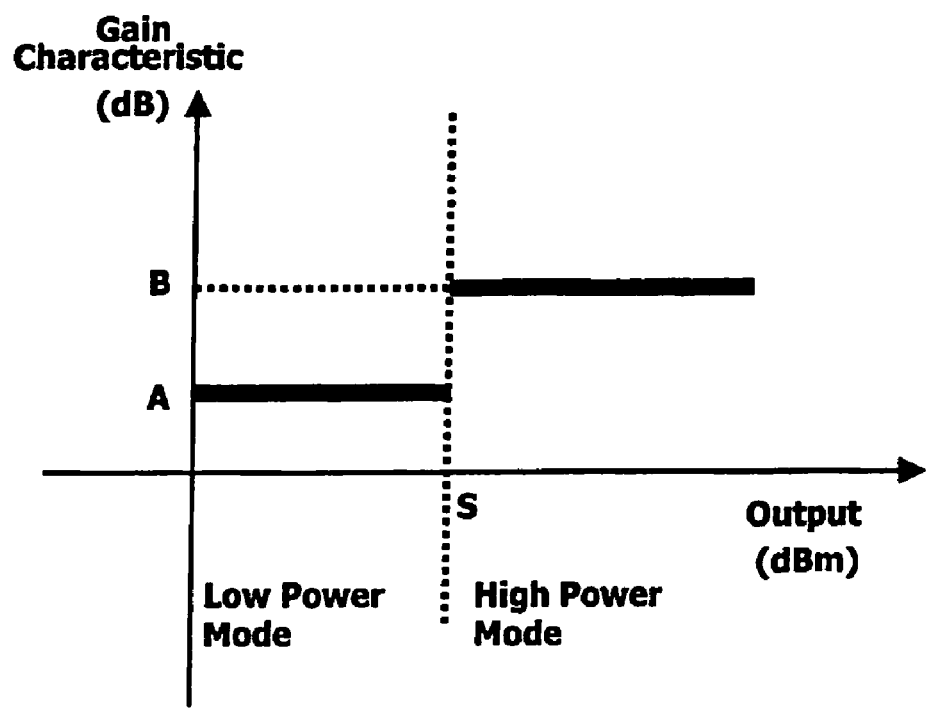
FIG. 7a is a graph illustrating gain characteristic corresponding to the high power mode and the low power mode of the multiple power mode power amplifier according to one embodiment of the present invention.

FIG. 7a is a graph illustrating a gain characteristic corresponding to the high power mode and the low power mode of the multiple power mode power amplifier according to one embodiment of the present invention.

Figure 7B:
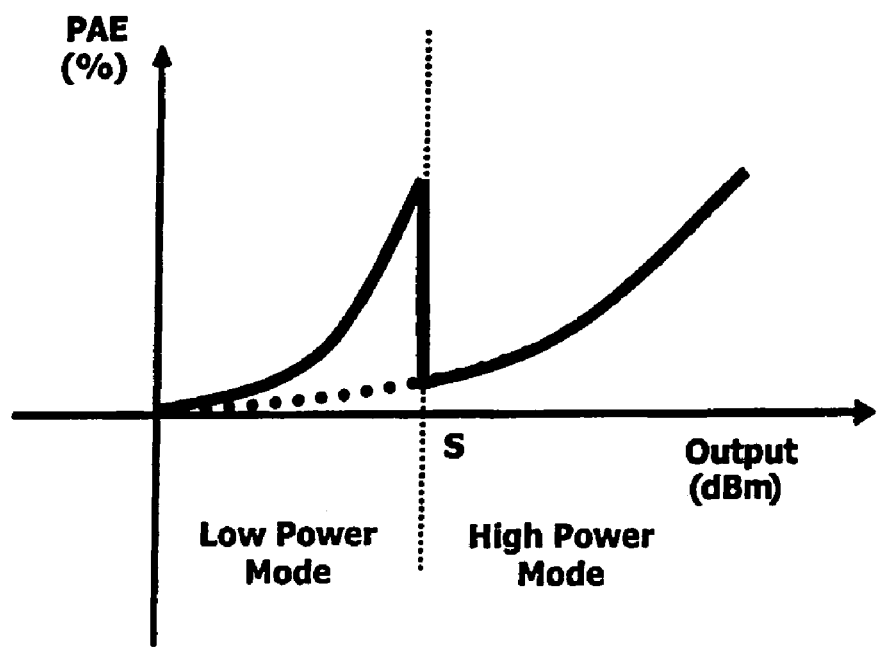
FIG. 7b is a graph illustrating power added efficiency (PAE) characteristic corresponding to the high power mode and the low power mode of the multiple power mode power amplifier according to one embodiment of the present invention.

In the low power mode, the power stage 120 is off, controlled by the applied voltage control circuit 90, so that an output of the driver 100 is not amplified by the power stage 120 and the output of the driver 100 is transferred to the output stage 78 through the impedance transformer 170. Thus, the gain characteristic is different from that when the output of the driver 100 is amplified by the power stage 120. The dotted line shows the gain when the power stage is on, while the solid line shows the gain when the power stage is off. In the low power mode, DC power is not consumed by the power stage 120, so that power added efficiency (PAE) characteristic is excellent. PAE is ((Pout−Pin)/Pdc). In FIG. 7b, the PAE when the power stage is on is shown by the dotted line, and when the power stage is off, the PAE is the solid line. Using the techniques of the invention, the amplifier has an excellent PAE in low power mode.

In contrast, in the high power mode, an output of the driver 100 is amplified by the power stage 120 and reaches the output stage 78 so that a power gain is added to the output of the driver 100 and the PAE characteristic depends on the power stage 120 that has generally high output power level.

Accordingly, as illustrated in FIG. 7a, a gain characteristic is comparatively low (i.e.; gain of A) in the low power mode and gain characteristic is comparatively high (i.e., gain of B) in the high power mode.

FIG. 7b is a graph illustrating a power added efficiency (PAE) characteristic corresponding to the high power mode and the low power mode of the multiple power mode power amplifier according to one embodiment of the present invention.

As illustrated in FIG. 7a, a PAE characteristic in the low power mode (see solid line) is excellent because DC power consumption by the power stage 120 can be removed. In the high power mode, output of the power stage 120 is transferred to the output stage 78 through the third impedance matching unit 150 and the fourth impedance matching unit 160, and the third impedance matching unit 150, the fourth impedance matching unit 160 and the impedance transformer 170 do not use a switch, so that output of the power stage 120 is transferred to the output stage 78 without loss and thus PAE characteristic in the high power mode is excellent.

Figure 8:
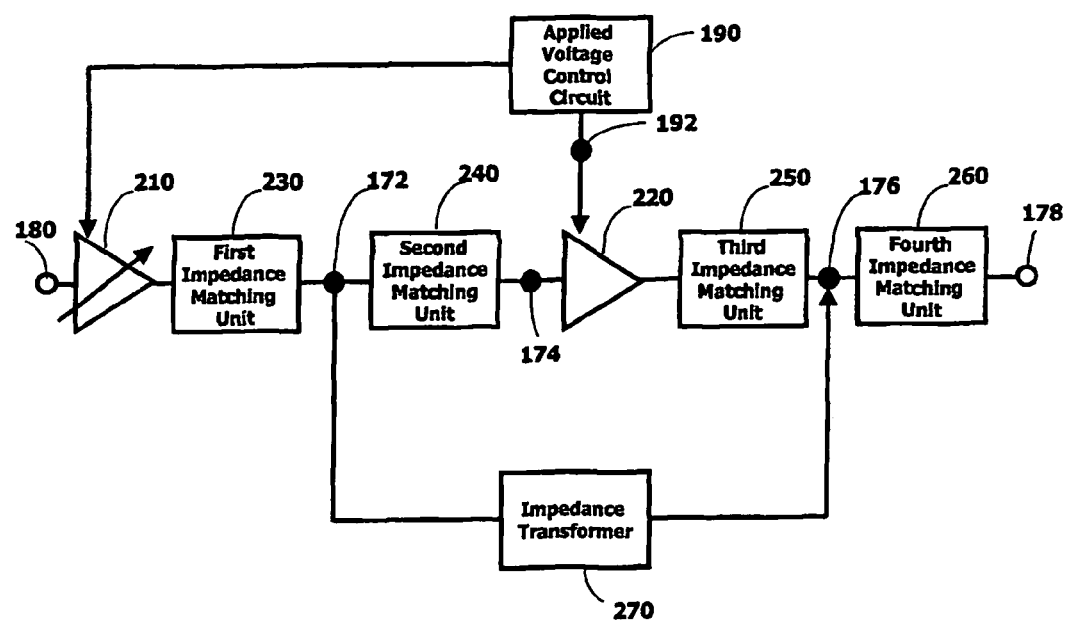
FIG. 8 illustrates a multiple power mode power amplifier with high efficiency using power mode transition structure without a bypass switching circuit according to another embodiment of the present invention.

FIG. 8 illustrates a multiple power mode power amplifier with high efficiency using power mode transition structure with bypass circuit without switches according to another embodiment of the present invention.

The multiple power mode power amplifier with high efficiency using power mode transition structure without a bypass switch according to another embodiment of the present invention includes: a driver 210 for variably amplifying gain of input signal using a variable gain amplifier; a power stage 220 for receiving power amplified by the driver 210 through a first impedance matching unit 230 connected to the driver 210 and a second impedance matching unit 240 connected to the first impedance matching unit 230, reamplifying the power and outputting the reamplified power; an applied voltage control unit 190, connected to the power stage 220, for controlling an applied voltage corresponding to the low power mode and the high power mode; an impedance transformer 270 for receiving through the first impedance matching unit 230 power amplified by the driver 210 according to operations of the applied voltage control circuit 190; a third impedance matching unit 250, connected to the power stage 220 in serial, for receiving power amplified by the power stage 220 according to operations of the applied power control circuit; and a fourth impedance matching unit 260, connected to the third impedance matching unit 250 and connected to the impedance transformer 270, for transferring the power transferred from the third impedance matching unit 250 or the impedance transformer 270, to an output stage 178 according to operations of the applied voltage control circuit.

The applied voltage control circuit 190 controls the driver in order for a gain of the driver to be changed corresponding to whether the circuit is in the low power mode or the high power mode. The applied voltage control circuit adjusts a signal such as a voltage supplied to the power stage 220 by exterior control signal inputs corresponding to the low power mode and the high power mode. In other embodiments of the invention, the control signal may be a current control. For the low power mode, the applied voltage control circuit 190 adjusts a signal such as a voltage applied to the power stage 220 in order for transistors of the power stage 220 to be off. Then a signal path passes through the optimized first impedance matching unit 230 and the optimized impedance transformer 270. The signal does not pass through power stage 220. In the low power mode, the signal will not be amplified as much as in the high power mode. And since the power stage 220 is off, power consumption is reduced. Low power mode is typically useful when the mobile phone is relatively close to the receiving antenna, which is more frequently the case in more densely populated areas such as cities. Under these circumstances, the low power mode is used more often and battery drain is reduced, thus increasing talk time.

In contrast, for the high power mode, a signal path passes through the first impedance matching unit 230, the second impedance matching unit 240, and the power stage 220. The applied voltage control circuit 190 applies a signal such as a voltage appropriate to turn on or enable operation of the transistors of power stage 220. The signal is amplified greater in the high power mode because the gain of the power stage 220 is enabled, thus allowing transmission of an RF signal greater distances. However, in the high power mode, the power consumption is greater because the power stage 220 is active and drawing current.

The variable gain amplifier variably amplifies signal inputted through an input terminal 180 of the power amplifier according to operations of the applied voltage control circuit 190 and supplies the amplified signal to the first impedance matching unit 230, the power stage 220 and the impedance transformer 270. The variable gain amplifier performs a role of not only a driver but also a linearizer, so that efficiency and linearity of circuit can be optimized. Further, discontinuous gain characteristic of the power amplifier illustrated in FIG. 7*a* can be adjusted corresponding to use.

The power stage 220 in the low power mode is off, controlled by the applied voltage control circuit 190, and the power stage 220 in the high power mode amplifies signal, amplified by the driver 210 and inputted into the power stage 220.

The first impedance matching unit 230 is a circuit optimized for optimal operations corresponding to the low power mode and the high power mode. The first impedance matching unit 230 selectively transfers input power amplified by the driver 210 corresponding to operation modes to the impedance transformer 270 or the power stage 220.

The second impedance matching unit 240 is a circuit optimized for optimal operations corresponding to the low power mode and the high power mode. The second impedance matching unit 240 transfers power, amplified by the variable gain amplifier and transferred through the first impedance matching unit 230, to the impedance transformer 270 in the low power mode and to the power stage 220 in the high power mode.

The impedance transformer 270 is an impedance transforming circuit that transforms impedance appropriately corresponding to the low power mode and the high power mode. In the low power mode, the impedance transformer 270 forms a path that bypasses the power stage 220, so that output of the driver 210 is transferred to output stage 178 of power amplifier.

The multiple power mode power amplifier according to the present invention is not limited to the embodiments discussed and may be implemented without departing from the scope and spirit of the invention as disclosed in the accompanying claims by various modification by those skilled in the art. For example, this application primarily describes an amplifier having two modes, a low power and a high power mode. The invention however may be easily extended to an amplifier having more than two different power modes. For example, the multiple power mode amplifier may have three, four, five, six, seven, or even greater number of modes. Having greater number of power modes may further reduce power consumption because the amplifier can be better optimized to use only as much power as needed to ensure proper operation (e.g., making a good connection to the wireless network), instead of wasting power by outputting too strong a signal.

The embodiments of the present invention have been described above for purposes of illustrating the present invention. It is not intended to be exhaustive or to limit the invention to the precise form described. Many modifications and variations are possible in light of the teaching above. Accordingly, the scope of the invention is defined by the appended claims.

What is claimed is:

1. An amplifier circuit comprising:
   a first circuit branch, coupled between a first node and a second node, comprising a first impedance matching unit and a power stage unit, coupled in series; and
   a second circuit branch, coupled between the first node and the second node, comprising an impedance transformer unit,
   wherein during a first mode of operation of the amplifier circuit, a signal path passes substantially through the first circuit branch, and during a second mode of operation of the amplifier circuit, the signal path passes substantially through the second circuit branch,
   and an impedance level at an input of the impedance transformer unit is determined by a combination of at least the first impedance unit and the impedance transformer unit.

2. The amplifier circuit of claim 1 wherein the first circuit branch further comprises a second impedance matching unit coupled in series with the first impedance matching unit and the power stage unit.

3. The amplifier circuit of claim 1 further comprising a control circuit providing a control signal coupled to the power stage unit to place the power stage unit in a first state during the first mode and a second state during the second mode.

4. The amplifier circuit of claim 1 wherein during the first mode, the power stage unit provides a high impedance, and during the second mode, the power stage unit provides gain.

5. The amplifier circuit of claim 1 wherein during the first mode, the power stage unit consumes less power than during the second mode.

6. The amplifier circuit of claim 1 wherein the signal path through the first branch does not pass through a switch device.

7. The amplifier circuit of claim 1 wherein the first branch does not include any of a relay, micromachined switch, transistor switch, PIN diode switch, or Schottky diode switch.

8. An integrated circuit comprising the amplifier circuit of claim 1.

9. A wireless transceiver device comprising the amplifier circuit as recited in claim 1.

10. An amplifier circuit comprising:
   a first circuit branch, coupled between a first node and a second node, comprising a first impedance matching unit and a power stage unit, coupled in series; and
   a second circuit branch, coupled between the first node and the second node, comprising an impedance transformer unit,
   wherein during a first mode of operation of the amplifier circuit, a signal path passes substantially through the first circuit branch, and during a second mode of operation of the amplifier circuit, the signal path passes substantially through the second circuit branch, and the signal path through the first circuit branch does not pass through a switch device, and the signal path through the second circuit branch does not pass through a switch device.

11. The amplifier of claim 10 wherein the switch devices comprise PIN diodes.

12. The amplifier circuit of claim 10 wherein the switch devices comprises any one of a relay, micromachined switch, transistor switch, switching diode, or Schottky diode switch.

13. The amplifier circuit of claim 10 wherein the first circuit branch further comprises a second impedance matching unit coupled in series with the first impedance matching unit and the power stage unit.

14. The amplifier circuit of claim 10 further comprising a control circuit providing a control signal coupled to the power stage unit to place the power stage unit in a first state during the first mode and a second state during the second mode.

15. The amplifier circuit of claim 10 wherein during the first mode, the power stage unit provides a high impedance, and during the second mode, the power stage unit provides gain.

16. An integrated circuit comprising the amplifier circuit of claim 10.

17. A wireless transceiver device comprising the amplifier circuit as recited in claim 10.

18. An amplifier circuit comprising:
   a first circuit branch, coupled between a first node and a second node, comprising a first impedance matching unit and a power stage unit, coupled in series; and
   a second circuit branch, coupled between the first node and the second node, comprising an impedance transformer unit,
   wherein during a first mode of operation of the amplifier circuit, a signal path passes through the first circuit branch, and during a second mode of operation of the amplifier circuit, the signal path passes through the second circuit branch,
   and the first circuit branch and second circuit branch do not comprise a switch device.

19. The amplifier circuit of claim 18 wherein the switch devices comprises any one of a relay, micromachined switch, transistor switch, switching diode, PIN diode, or Schottky diode switch.

20. The amplifier circuit of claim 18 further comprising:
   a control circuit providing a control signal coupled to the power stage unit to place the power stage unit in a first state during the first mode and a second state during the second mode.

21. The amplifier circuit of claim 18 wherein during the first mode, the power stage unit provides a high impedance, and during the second mode, the power stage unit provides gain.

* * * * *